United States Patent
Yoshie et al.

(10) Patent No.: US 6,580,736 B1
(45) Date of Patent: Jun. 17, 2003

(54) SEMICONDUCTOR LIGHT EMITTING DEVICE

(75) Inventors: Tomoyuki Yoshie, Pasadena, CA (US); Takenori Goto, Moriguchi (JP); Nobuhiko Hayashi, Osaka (JP)

(73) Assignee: Sanyo Electric Company, Ltd., Moriguchi (JP)

( * ) Notice: Subject to any disclaimer, the term of this patent is extended or adjusted under 35 U.S.C. 154(b) by 0 days.

(21) Appl. No.: 09/533,970

(22) Filed: Mar. 23, 2000

(30) Foreign Application Priority Data

Mar. 25, 1999 (JP) .............................. 11-082511

(51) Int. Cl.[7] .................................... H01S 5/00
(52) U.S. Cl. ............................ 372/45; 372/45; 372/46; 372/43
(58) Field of Search ....................... 372/45, 46

(56) References Cited

U.S. PATENT DOCUMENTS 5,987,048 A * 11/1999 Ishikawa et al. ............... 372/46
6,181,723 B1 * 1/2001 Okubo et al. .................. 372/45

FOREIGN PATENT DOCUMENTS

| JP | 08-088441 | 4/1996 |
| JP | 09-232680 | 9/1997 |
| JP | 9-246651 | 9/1997 |

OTHER PUBLICATIONS

Jpn. J. Appl. Phys. vol. 37 (1998) pp. 1470–1473, Part 1, No. 3B, Mar. 1998; "Reactive Ion Beam Etching and Overgrowth Process in the Fabrication of InGaN Inner Stripe Laser Diodes".

Proceedings of the Second International Conference on Nitride Semiconductors; pp.418–419.

* cited by examiner

Primary Examiner—Paul Ip
Assistant Examiner—Armando Rodriguez
(74) Attorney, Agent, or Firm—Armstrong, Westerman & Hattori, LLP (57) ABSTRACT

In a semiconductor laser device, a buffer layer, an n-contact layer, an n-light cladding layer, an n-light guide layer, an emission layer, a p-cap layer, a p-light guide layer and an n-current blocking layer having a striped opening are successively formed on a sapphire substrate, and a p-light cladding layer is formed in the opening. A p-contact layer is formed on the p-light cladding layer and on the n-current blocking layer. The n-current blocking layer is made of $n-Al_{0.3}Ga_{0.7}N$ and has an electron concentration of $1\times10^{17}$ $cm^{-3}$ and an Al composition greater than 0.1, and the surface thereof is terminated with N.

17 Claims, 4 Drawing Sheets

SEMICONDUCTOR LIGHT EMITTING DEVICE

BACKGROUND OF THE INVENTION

1. Field of the Invention

The present invention relates to a semiconductor light emitting device.

2. Description of the Prior Art

A semiconductor light emitting device such as a semiconductor laser device or a light emitting diode employing a group III nitride semiconductor (hereinafter referred to as a nitride based semiconductor) such as GaN, GaInN, AlGaN or AlGaInN is expected for application to a light emitting device emitting light over the visible to ultraviolet regions. Such a semiconductor light emitting device is formed on a (0001) plane of a substrate of sapphire, silicon carbide or the like by MOVCD (metal-organic chemical vapor deposition) or MBE (molecular beam epitaxy).

In a GaN based semiconductor light emitting device formed by successively stacking an n-type semiconductor layer, an emission layer and a p-type semiconductor layer on a substrate, an n-type current blocking layer is generally formed in the p-type semiconductor layer. This current blocking layer performs transverse mode control of the semiconductor light emitting device.

Figure 7:
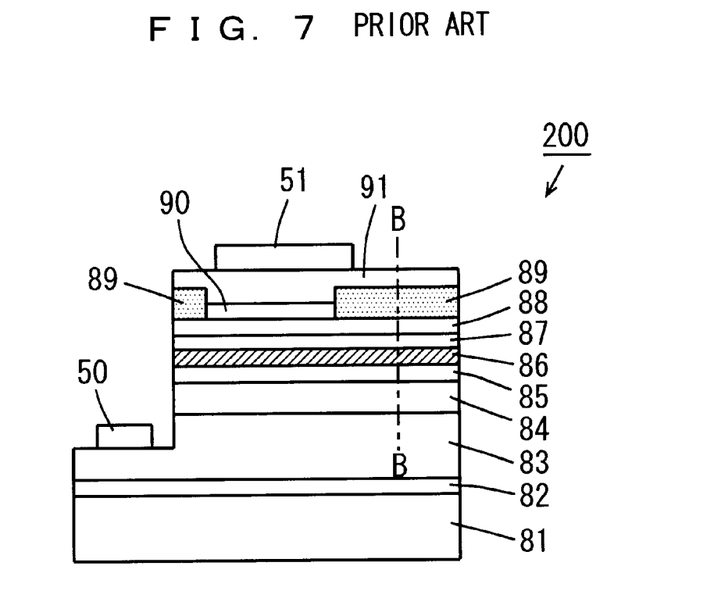
FIG. 7 is a typical sectional view of a conventional GaN based semiconductor laser device.

FIG. 7 is a typical sectional view showing an exemplary conventional GaN based semiconductor laser device 200.

In the semiconductor laser device 200 shown in FIG. 7, a buffer layer 82 of undoped AlGaN, an n-contact layer 83 of n-GaN, an n-light cladding layer 84 of n-AlGaN, an n-light guide layer 85 of n-GaN, an emission layer 86, a p-cap layer 87 of p-AlGaN, a p-light guide layer 88 of p-GaN and an n-current blocking layer 89 having an opening are successively formed on a sapphire substrate 81. A p-light cladding layer 90 of p-AlGaN is formed in the opening of the n-current blocking layer 89. A p-contact layer 91 of p-GaN is formed on the p-light cladding layer 90 and the n-current blocking layer 89.

Partial regions of the layers from the p-contact layer 91 to the n-contact layer 83 are etched so that an n-type electrode 50 is formed on the exposed part of the n-contact layer 83. A p-type electrode 51 is formed on the p-contact layer 91.

In the semiconductor laser device 200, the n-current blocking layer 89 narrows current injected from the p-type electrode 51. Thus, the opening of the n-current blocking layer 89 defines a current injection region while an emission part is formed in the region of the emission layer 86 located under the current injection region.

The material for the current blocking layer 89 may be n-AlGaN, n-InGaN or the like.

When prepared from n-AlGaN, the n-current blocking layer 89 has a small refractive index due to Al contained therein. The region of the emission layer 86 located under the n-current blocking layer 89 having a small refractive index exhibits a smaller effective refractive index as compared with the region of the emission layer 86 located under the opening. Light is horizontally confined in the emission layer 86 due to such distribution of the refractive index. This device structure confining light by the difference in refractive index is referred to as a real refractive index guided structure.

When prepared from n-InGaN, on the other hand, the n-current blocking layer 89 having a smaller band gap than the emission layer 86 absorbs light of a higher mode generated in the emission layer 86. Thus, light is concentrated to the region of the emission layer 86 located under the opening of the current blocking layer 89, and horizontally confined in the emission layer 86. This device structure confining light by light absorption is referred to as a loss guided structure.

As described above, transverse mode control is performed in the semiconductor laser device 200 due to the current narrowing in the n-current blocking layer 89 and confinement of light in the emission layer 86.

In the semiconductor laser device 200 having the n-current blocking layer 89 of n-AlGaN, the electron concentration in the n-current blocking layer 89 is generally extremely increased to $10^{19}$ to $10^{20}$ cm$^{-3}$, thereby suppressing leakage of current in the n-current blocking layer 89 and reducing current which does not contribute to the laser oscillation.

In order to increase the effect of transverse mode control in the semiconductor laser device 200, the Al composition of the n-current blocking layer 89 made of n-AlGaN is preferably increased. When the Al composition is increased, the refractive index of the n-current blocking layer 89 is further reduced thereby increasing the difference in refractive index of the emission layer 86 along the horizontal direction. Thus, light is effectively confined.

When having a large Al composition, the n-current blocking layer 89 exhibits a lattice constant smaller than that of the n-contact layer 83, to generate an electric field (piezoelectric field) as a result of piezoelectric effect caused by tensile strain. However, electrons of a high concentration are injected into the n-current blocking layer 89 and hence the piezoelectric field is reduced by movement of the electrons. Thus, the energy band is inhibited from bending caused by the piezoelectric effect.

Figure 8:
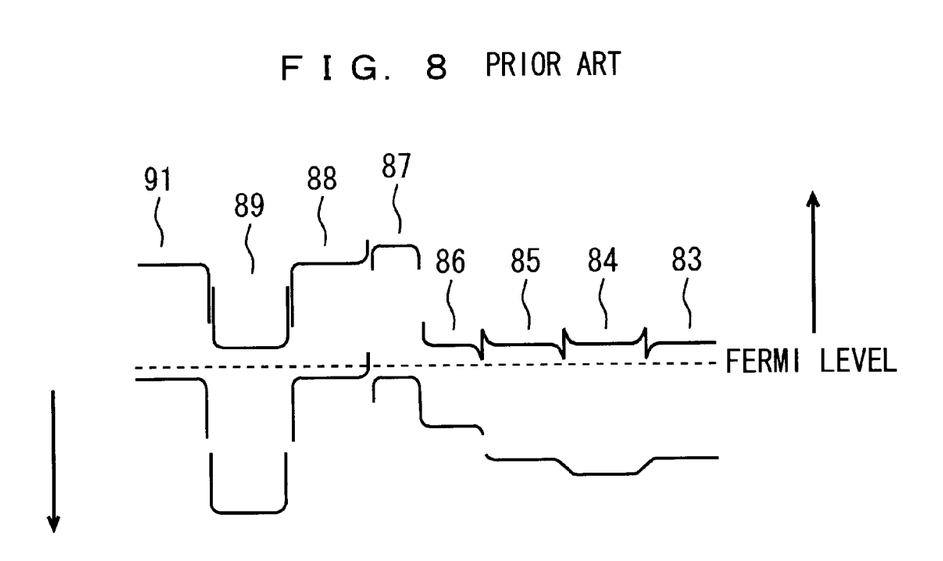
FIG. 8 is a model diagram showing the energy band structure of the semiconductor laser device shown in FIG. 7 in a section taken along the line B—B in FIG. 7.

FIG. 8 is a model diagram showing the energy band structure of the semiconductor laser device 200 having the n-current blocking layer 89 of n-AlGaN in a section taken along the line B—B in FIG. 7. Referring to FIG. 8, positive bias applied between the p-type electrode 51 and the n-type electrode 50 is zero.

As shown in FIG. 8, the energy band of the n-current blocking layer 89 is flat since the high-concentration electrons suppress the piezoelectric effect in the n-current blocking layer 89.

When applying positive bias between the p-type electrode 51 and the n-type electrode 50 of the semiconductor laser device 200, a quasi Fermi level lowers on the side of the p-contact layer 91 and rises on the side of the n-contact layer 83 as shown by arrows in FIG. 8. Thus, the energy band of the n-current blocking layer 89 is inclined toward the upper right. When applying higher positive bias, the inclination of the energy band of the n-current blocking layer 89 is so increased that holes can move from the p-contact layer 91 to the p-light guide layer 88 through the n-current blocking layer 89 due to tunnel effect if the n-current blocking layer 89 has a small thickness. Consequently, current which does not contribute to the laser oscillation is increased. Further, holes falling to the level in the n-current blocking layer 89 cause recombination different from desirable emission, to increase the current which does not contribute to the laser oscillation.

Such current that does not, contribute to the laser oscillation can be suppressed by increasing the thickness of the n-current blocking layer 89. When thickly growing the n-current blocking layer 89 having a high Al composition, however, cracking results from strain caused by lattice incommensurateness with the n-contact layer 83. Therefore, it is difficult to increase the thickness of the n-current blocking layer 89 of n-AlGaN.

Transverse mode control can be performed with the n-current blocking layer 89 whose thickness is small to some extent. When the n-current blocking layer 89 has a small thickness, however, it is difficult to suppress leakage of current caused by the aforementioned tunnel effect and hence the current which does not contribute to the laser oscillation is increased. Thus, operating current and threshold current of the semiconductor laser device 200 are increased to reduce the luminous efficiency.

Also in a semiconductor laser device of the loss guided structure having an n-current blocking layer of n-InGaN, current which does not contribute to the laser oscillation is increased if the n-current blocking layer has a small thickness and hence operating current and threshold current of the semiconductor laser device are increased to reduce the luminous efficiency similarly to the semiconductor laser device 200 having the current blocking layer 89 of n-AlGaN.

SUMMARY OF THE INVENTION

An object of the present invention is to provide a semiconductor light emitting device having low operating current and low threshold current with high luminous efficiency, which can reduce of current which does not contribute to the laser oscillation.

The semiconductor light emitting device according to the present invention comprises a first conductivity type first semiconductor layer, a second conductivity type second semiconductor layer having a current injection region, an emission layer provided between the first semiconductor layer and the second semiconductor layer, into which current is injected through the current injection region due to application of positive bias between the first semiconductor layer and the second semiconductor layer, and a current blocking layer, provided in the second semiconductor layer except the current injection region, containing an electric field reverse to the positive bias.

In this semiconductor light emitting device, the current blocking layer contains the electric field reverse to the positive bias, whereby the positive bias applied between the first semiconductor layer and the second semiconductor layer reduces the electric field contained in the current blocking layer. Thus, a potential gradient in the current blocking layer disappears or decreases so that no current leakage results from tunnel effect but current is reliably blocked in the current blocking layer. Thus, current which does not contribute to the laser oscillation decreases and operating current as well as threshold current are reduced in the semiconductor light emitting device, whereby a semiconductor light emitting device having high luminous efficiency is obtained.

The current blocking layer may contain the electric field reverse to the positive bias by piezoelectric effect. In this case, the electric field is generated in the current blocking layer by the piezoelectric effect. The electric field reverse to the positive bias can be contained in the current blocking layer by setting the composition of the current blocking layer so that the electric field by the piezoelectric effect is reverse to the positive bias.

The current blocking layer may have strain accompanied by generation of the electric field reverse to the positive bias. In this case, the electric field is generated in the current blocking layer due to the strain of the current blocking layer. The electric field reverse to the positive bias can be contained in the current blocking layer by setting the composition of the current blocking layer so that the electric field generated by the strain is reverse to the positive bias.

The second semiconductor layer may include a first conductivity type carrier concentration layer, stacked on the current blocking layer, having a carrier concentration higher than that of the current blocking layer.

When the first conductivity type high carrier concentration layer is provided between the current blocking layer and the second conductivity type second semiconductor layer, a depletion layer is formed in the second semiconductor layer having a lower carrier concentration than the high carrier concentration layer.

In the semiconductor light remitting device having no depletion layer formed in the current blocking layer, carriers in the second semiconductor layer are prevented from diffusing into the current blocking layer thorough the depletion layer. Thus, current can be further reliably prevented in the current blocking layer.

The current blocking layer may be made of a nitride based semiconductor containing at least one of gallium, aluminum, indium, thallium and boron, and the first semiconductor layer, the emission layer and the second semiconductor layer may be made of a nitride based semiconductor containing at least one of gallium, aluminum, indium, thallium and boron. In such a nitride based semiconductor, the electric field generated by the piezoelectric effect remarkably appears.

The current blocking layer preferably has a crystal growth surface prepared from a (0001) plane of the nitride based semiconductor. In the current blocking layer having such a crystal growth surface, the piezoelectric effect is maximized so that the current blocking layer contains the electric field reverse to the positive bias.

The carrier concentration of the current blocking layer is preferably lower than $1 \times 10^{19}$ cm$^{-3}$.

If the carrier concentration of the current blocking layer is higher than $1 \times 10^{19}$ cm$^{-3}$, the electric field generated by the piezoelectric effect is reduced and hence a potential gradient is caused in the current blocking layer upon application of positive bias. When the carrier concentration of the current blocking layer is lower than $1 \times 10^{19}$ cm$^{-3}$, the current blocking layer can contain the electric field reverse to the positive bias by the piezoelectric effect, whereby the potential gradient in the current blocking layer decreases or disappears upon application of positive bias.

The refractive index of the current blocking layer may be smaller than the refractive index of the current injection region. In this case, the effective refractive index of the region of the emission layer located under the current blocking layer is reduced as compared with the effective refractive index of the region of the emission layer located under the current injection region. Light is horizontally confined in the emission layer due to such difference in refractive index in the emission layer. Thus, a semiconductor light emitting device having a real refractive index guided structure is implemented.

The current blocking layer may be made of a nitride based semiconductor containing aluminum and gallium and the surface of the current blocking layer may be terminated with nitrogen while the aluminum composition thereof may be greater than 0.1. The semiconductor light emitting device may further comprise a sapphire substrate, and the first semiconductor layer, the emission layer, the second semiconductor layer and the current blocking layer may be formed on the sapphire substrate.

In this case, the refractive index of the current blocking layer containing aluminum can be reduced. Thus, a semiconductor light emitting device having a real refractive index guided structure is implemented.

Further, the aluminum composition of the current blocking layer is greater than 0.1 and the surface of the current blocking layer is terminated with nitrogen, whereby the current blocking layer contains the electric field reverse to the positive bias.

Particularly in a nitride based semiconductor containing aluminum and gallium formed on a sapphire substrate, piezoelectric effect is caused by strain. Thus, the current blocking layer made of the nitride based semiconductor containing aluminum and gallium formed on the sapphire substrate contains the electric field reverse to the positive bias.

The current blocking layer may made of a nitride based semiconductor containing aluminum and gallium and the surface f the current blocking layer may be terminated with gallium and aluminum, while the aluminum composition may be less than 0.1. The semiconductor light emitting device may further comprise a sapphire substrate, and the first semiconductor layer, the emission layer, the second semiconductor layer and the current blocking layer may be formed on the sapphire substrate.

In this case, the refractive index of the current blocking layer containing aluminum can be reduced. Thus, a semiconductor light emitting device having a real refractive index guided structure is implemented.

Further, the aluminum composition of the current blocking layer is less than 0.1 and the surface of the current blocking layer is terminated with gallium and aluminum, i.e., group III elements, whereby the current blocking layer contains the electric field reverse to the positive bias.

Particularly in a nitride based semiconductor containing aluminum and gallium formed on a sapphire substrate, piezoelectric effect is caused by strain. Thus, the current blocking layer made of the nitride based semiconductor containing aluminum and gallium formed on the sapphire substrate contains the electric field reverse to the positive bias.

The band gap of the current blocking layer may be not more than the band gap of the emission layer.

In this case, the current blocking layer absorbs light of a higher mode generated in the emission layer. Thus, light is concentrated to the region of the emission layer located under the current injection region and horizontally confined in the emission layer. Therefore, a semiconductor light emitting device having a loss guided structure is implemented.

The current blocking layer may be made of a nitride based semiconductor containing indium and gallium. The semiconductor light emitting device may further comprise a silicon carbide substrate, and the first semiconductor layer, the emission layer, the second semiconductor layer and the current blocking layer may be formed on the silicon carbide substrate.

In this case, the band gap of the current blocking layer containing indium can be rendered smaller than the band gap of the emission layer. Thus, a semiconductor light emitting device having a loss guided structure is implemented.

Particularly in a nitride based semiconductor containing indium and gallium formed on a silicon carbide substrate, piezoelectric effect is caused by strain. Thus, the current blocking layer made of the nitride based semiconductor containing indium and gallium formed on the silicon carbide substrate contains the electric field reverse to the positive bias.

The first semiconductor layer may include a first conductivity type cladding layer, and the second semiconductor layer may include a second conductivity type cladding layer. In this case, a semiconductor light emitting device having high luminous efficiency is implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
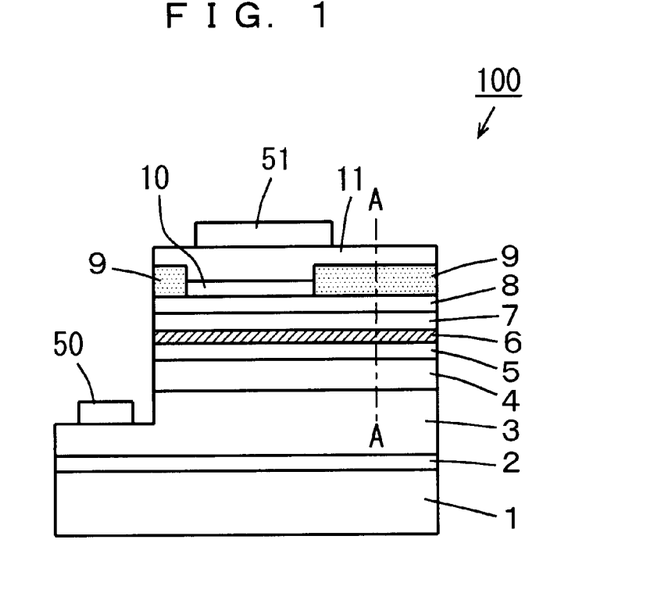
FIG. 1 is a typical sectional view of a GaN based semiconductor laser device according to a first embodiment of the present invention.

FIG. 1 is a typical sectional view of a semiconductor laser device 100 according to a first embodiment of the present invention.

In the semiconductor laser device 100 shown in FIG. 1, a buffer layer 2 of undoped $Al_{0.5}Ga_{0.5}N$, an n-contact layer 3 of n-GaN, an n-light cladding layer 4 of n-$Al_{0.06}Ga_{0.94}N$, an n-light guide layer 5 of n-GaN, an emission layer 6, a p-cap layer 7 of p-$Al_{0.2}Ga_{0.8}N$, a p-light guide layer 8 of p-GaN and an n-current blocking layer 9 of n-$Al_{0.3}Ga_{0.7}N$ having a striped opening are successively formed on a (0001) plane of a sapphire substrate 1 by MOCVD (metal-organic chemical vapor deposition). A p-light cladding layer 10 of p-$Al_{0.06}Ga_{0.94}N$ is formed in the opening of the n-current blocking layer 9. A p-contact layer 11 of p-GaN is formed on the p-light cladding layer 10 and the n-current blocking layer 9.

Partial regions of the layers from the p-contact layer 11 to the n-contact layer 3 are,etched so that an n-type electrode 50 prepared by stacking a Ti film of 100 nm in thickness, an Al film of 200 nm in thickness and an Au film of 500 nm in thickness in this order is formed on the exposed part of the n-contact layer 3. A p-type electrode 51 prepared by stacking a Pt film of 400 nm in thickness and an Au film of 500 nm in thickness in this order is formed on the p-contact layer 11. Thus, the semiconductor laser device 100 has a self-alignment structure. Table 1 shows the thicknesses and carrier concentrations of the layers 2 to 11.

TABLE 1

|  | Carrier Concentration (cm$^{-3}$) | Thickness (nm) |
| --- | --- | --- |
| Buffer Layer 2 | — | 20 |
| n-Contact Layer 3 | $1 \times 10^{19}$ | 4000 |
| n-Light Cladding Layer 4 | $9 \times 10^{18}$ | 700 |
| n-Light Guide Layer 5 | $6 \times 10^{18}$ | 100 |
| Emission     n-In$_{0.03}$Ga$_{0.97}$N | $1 \times 10^{18}$ | 10 |
| Layer         In$_{0.10}$Ga$_{0.90}$N 6 | — | 5 |
| p-Cap Layer 7 | $7 \times 10^{17}$ | 20 |
| p-Light Guide Layer 8 | $1 \times 10^{18}$ | 100 |
| n-Current Blocking Layer 9 | $1 \times 10^{17}$ | 500 |
| p-Light Cladding Layer 10 | $7 \times 10^{17}$ | 450 |
| p-Contact Layer 11 | $1 \times 10^{18}$ | 500 |

The emission layer 6 has a multiple quantum well structure formed by alternately stacking four quantum barrier layers of n-In$_{0.03}$Ga$_{0.97}$N each having a thickness of 10 nm and three quantum well layers of In$_{0.1}$Ga$_{0.9}$N each having a thickness of 5 nm.

In the semiconductor laser device 100, the n-current blocking layer 9 narrows current injected from the p-type electrode 51. Thus, the opening of the n-current blocking layer 9 defines a current injection region and an emission part is formed in the region of the emission layer 6 located under the current injection region.

The region of the emission layer 6 located under the n-current blocking layer 9 having a smaller refractive index than the p-light cladding layer 10 exhibits a smaller effective refractive index as compared with the region of the emission layer 6 located under the current injection region. Therefore, light is horizontally confined in the emission layer 6. Thus, the semiconductor laser device 10 has a real refractive index guided structure.

Transverse mode control is performed in the semiconductor laser device 100 due to the current narrowing by the n-current blocking layer 9 and light confinement in the emission layer 6 as described above.

The Al composition of the n-current blocking layer 9 is greater than 0.1. The surface of the n-current blocking layer 9 is terminated with N. The n-current blocking layer 9, having a smaller lattice constant than the n-contact layer 3, is subject to tensile strain. Thus, an electric field is generated by piezoelectric effect in the n-current blocking layer 9. Such an electric field that the potential on the side of the sapphire substrate 1 is low and the potential on the side of the p-type electrode 51 is high is referred to as a positive piezoelectric field. The n-current blocking layer 9 has an electron concentration of $1 \times 10^{17}$ cm$^{-3}$, which is lower than the electron concentration of, the current blocking layer of the conventional semiconductor laser device, and hence the piezoelectric field is not reduced by movement of electrons but the n-current blocking layer 9 contains a positive piezoelectric field.

Figure 2:
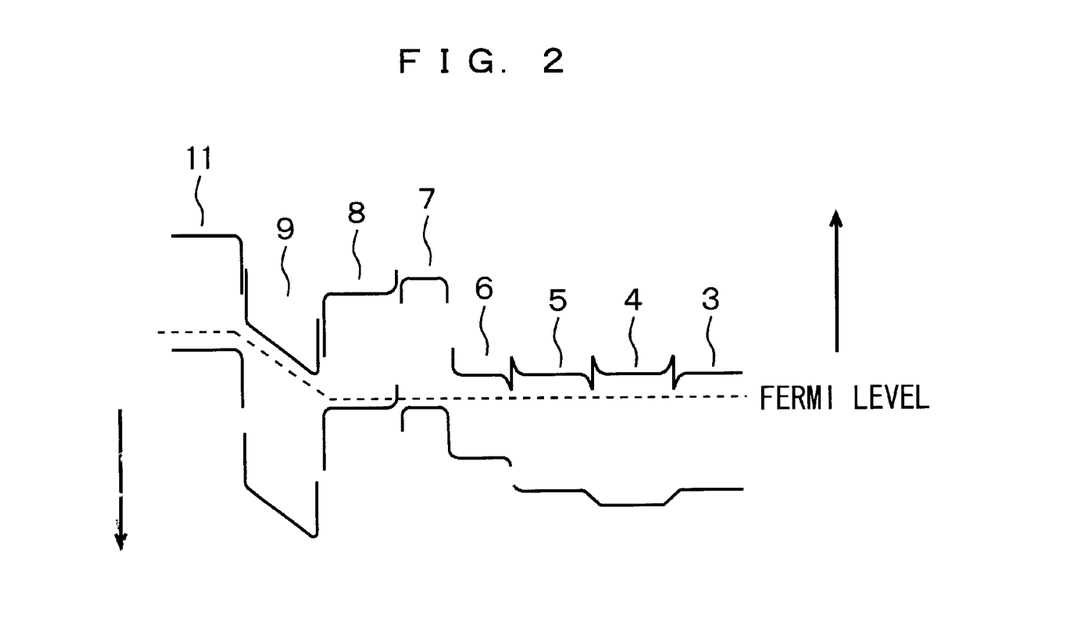
FIG. 2 is a model diagram showing the energy band structure of the semiconductor laser device shown in FIG. 1 in a section taken along the line A—A.

FIG. 2 is a model diagram showing the energy band structure of the semiconductor laser device 100 in a section taken along the line A—A in FIG. 1. Referring to FIG. 2, positive bias applied between the p-type electrode 51 and the n-type electrode 50 is zero.

As shown in FIG. 2, the energy band is bent due to the positive piezoelectric field contained in the n-current blocking layer 9, and inclined toward the lower right.

When applying positive bias to the semiconductor laser device 100, a quasi Fermi level lowers on the side of the p-contact layer 11 and rises on the side of the n-contact layer 3 as shown by arrows in FIG. 2. Thus, the energy band of the n-current blocking layer 9 is flattened to reduce the positive piezoelectric field. Thus, in the n-current blocking layer 9 containing the positive piezoelectric field, the applied positive bias is employed for canceling the piezoelectric field.

In the semiconductor laser device 100, the energy band of the n-current blocking layer 9 is flattened upon application of positive bias as described above, whereby holes are inhibited from moving from the p-contact layer 11 to the p-light guide layer 8 through the n-current blocking layer 9 by tunnel effect and leakage of current in the n-current blocking layer 9 is prevented. Further, the holes are prevented from falling from the p-contact layer 11 to the level of the n-current blocking layer 9 and causing recombination different from desired emission. Thus, current which does not contribute to the laser oscillation is reduced to reduce operating current and threshold current of the semiconductor laser device 100, whereby a semiconductor laser device having high luminous efficiency is obtained.

Figure 3:
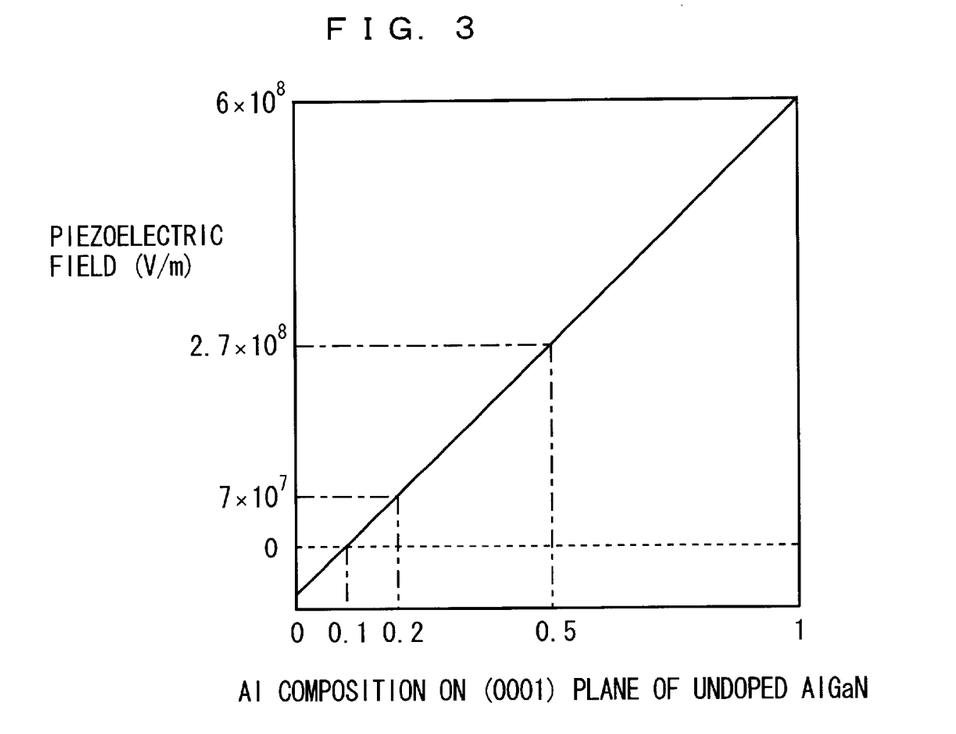
FIG. 3 illustrates the relation between an Al composition on a (0001) plane of undoped AlGaN and a piezoelectric field.

FIG. 3 shows the relation between an Al composition on a (0001) plane of undoped AlGaN and a piezoelectric field. Referring to FIG. 3, the surface of AlGaN is terminated with N.

As shown in FIG. 3, the magnitude and the sign of the piezoelectric field vary with the Al composition of AlGaN. When the Al composition of AlGaN exceeds 0.1, a positive piezoelectric field is generated. When the Al composition is less than 0.1, on the other hand, a negative piezoelectric field is generated.

When the Al composition in AlGaN is 0.2, for example, a positive piezoelectric field of $7 \times 10^7$ V/m is generated. Therefore, a current blocking layer made of AlGaN having such an Al composition with a thickness of 500 nm contains a positive piezoelectric field of 35 V. Positive bias applied in operation of a general semiconductor laser device is not more than 10 V, and hence the positive piezoelectric field contained in the current blocking layer is not completely canceled, not to generate a reverse electric field. Therefore, no current resulting from tunnel effect flows in the current blocking layer but the current blocking layer reliably blocks current to reduce current which does not contribute to the laser oscillation.

On the other hand, the energy band of a current blocking layer having an Al composition less than 0.1 and containing a negative piezoelectric field is inclined toward the upper right contrarily to that shown in FIG. 2. When applying positive bias to a semiconductor laser device having such a current blocking layer containing a negative piezoelectric field, the inclination of the energy band of the current blocking layer is further increased to result in tunnel effect increasing current which does not contribute to the laser oscillation. Therefore, the Al composition of the current blocking layer is set in the range generating a positive piezoelectric field, i.e., the range greater than 0.1.

While FIG. 3 shows the case of undoped AlGaN, relation similar to that shown in FIG. 3 also holds between an Al composition in n-AlGaN and a piezoelectric field, except that the inclination of the straight line in FIG. 3 is reduced. Therefore, the Al composition in the n-current blocking layer 9 is set greater than 0.1.

The piezoelectric field contained in the n-current blocking layer 9 varies with the material forming the surface of the n-current blocking layer 9. The surface of AlGaN formed on the sapphire substrate 1 by MOCVD as in this embodiment is terminated with N. On the other hand, the surface of AlGaN formed on the sapphire substrate 1 by MBE (molecular beam epitaxy) is terminated with Ga and Al. In this case, relation reverse to that shown in FIG. 3 holds between the Al composition in AlGaN and a piezoelectric field. In other words, a negative piezoelectric field is generated when the Al composition is rendered greater than 0.1 while a positive piezoelectric field is generated when the Al composition is rendered less than 0.1. When the n-current blocking layer 9 is terminated with Ga, therefore, the Al composition is set less than 0.1. Thus, the n-current blocking layer 9 contains a positive piezoelectric field, whereby current which does hot contribute to the laser oscillation can be reduced.

The plane orientation of the n-current blocking layer 9 may be other than the (0001) plane so far as a potential gradient is caused by strain. So far as the plane orientation of the n-current blocking layer 9 is other than that including a [100] axis in the plane, a potential gradient is normally caused by strain with any plane orientation. In other words, a potential gradient is caused with any plane orientation so far as the plane orientation of the n-current blocking layer 9 is other than plane orientation (1100)plane or (1120)plane, for example) expressed in a general formula (HKL0) plane, where H, K and L represent arbitrary numbers satisfying relation H+K+L=0 excluding H=K=L=0. The n-current blocking layer 9 preferably has a main surface of the (0001) plane due to the maximum effect of causing a potential gradient normally along the n-current blocking layer 9.

Figure 4:
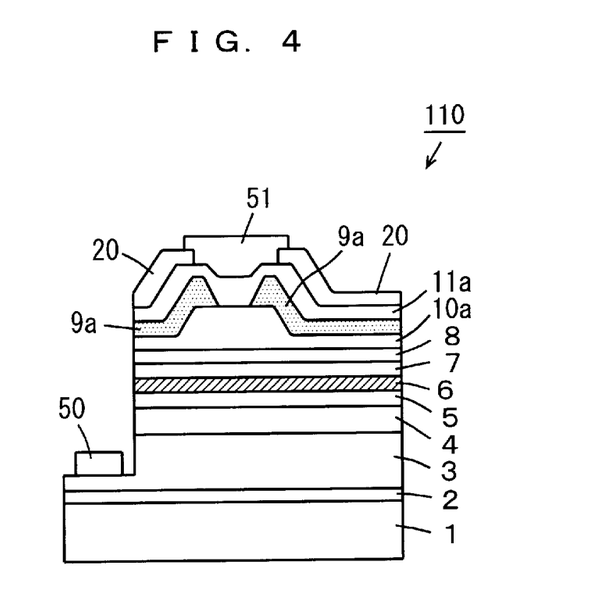
FIG. 4 is a typical sectional view of a GaN based semiconductor laser device according to a second embodiment of the present invention.

FIG. 4 is a typical sectional view of a semiconductor laser device 110 according to a second embodiment of the present invention.

In the semiconductor laser device 110 shown in FIG. 4, layers 2 to 8 are formed on a sapphire substrate 1, similarly to the semiconductor laser device 100.

A p-light cladding layer 10a of p-$Al_{0.1}Ga_{0.9}N$ is formed on the p-light guide layer 8, and this p-light cladding layer 10a is etched to have a ridge part. Further, an n-current blocking layer 9a of n-$Al_{0.3}Ga_{0.7}N$ having an opening located on the upper surface of the ridge part is formed on the p-light cladding layer 10a, and a p-contact layer 11a of p-GaN is formed on the p-light cladding layer 10a and the n-current blocking layer 9a in the opening. An insulating film 20 of $SiO_2$ having a thickness of 500 nm is formed on the region of the n-current blocking layer 9a located on the p-contact layer 11a.

Partial regions of the layers from the p-contact layer 11a to the n-contact layer 3 are etched so that an n-type electrode 50 is formed on the n-contact layer 3. A p-type electrode 51 is formed on the p-contact layer 11a. Thus, the semiconductor laser device 110 has a ridge guided structure.

The thicknesses and carrier concentrations of the layers 9a, 10a and 11a forming the semiconductor laser device 110 are similar to those of the layers 9, 10 and 11 forming the semiconductor laser device 100 shown in Table 1. In this case, the thicknesses of the p-light cladding layer 10a and the p-contact layer 11a are those of flat parts located on both sides of the ridge part.

In the semiconductor laser device 110, the insulating film 20 and the n-current blocking layer 9a narrow current injected from the p-type electrode 51. Thus, a current injection region is defined in the ridge part while an emission part is formed in the region of the emission layer 6 located under the current injection region.

The n-current blocking layer 9a has a smaller refractive index than the p-light cladding layer 10a, to result in difference in effective refractive index along the horizontal direction of the emission layer 6. Thus, light is horizontally confined in the emission layer 6.

Transverse mode control is performed in the semiconductor laser device 110 due to the aforementioned current narrowing by the n-current: blocking layer 9a and light confinement in the emission layer 6.

The n-current blocking layer 9a of the semiconductor laser device 110 has an Al composition greater than 0.1 and an electron concentration of $1 \times 10^{17}$ $cm^{-3}$, and the surface thereof is terminated with N. Thus, the n-current blocking layer 9a contains a positive piezoelectric field. Therefore, positive bias applied to the semiconductor laser device 110 is employed for canceling the piezoelectric field contained in the n-current blocking layer 9a. Thus, current which does not contribute to the laser oscillation is reduced in the semiconductor laser device 110 to reduce operating current and threshold current, whereby luminous efficiency is improved.

Figure 5:
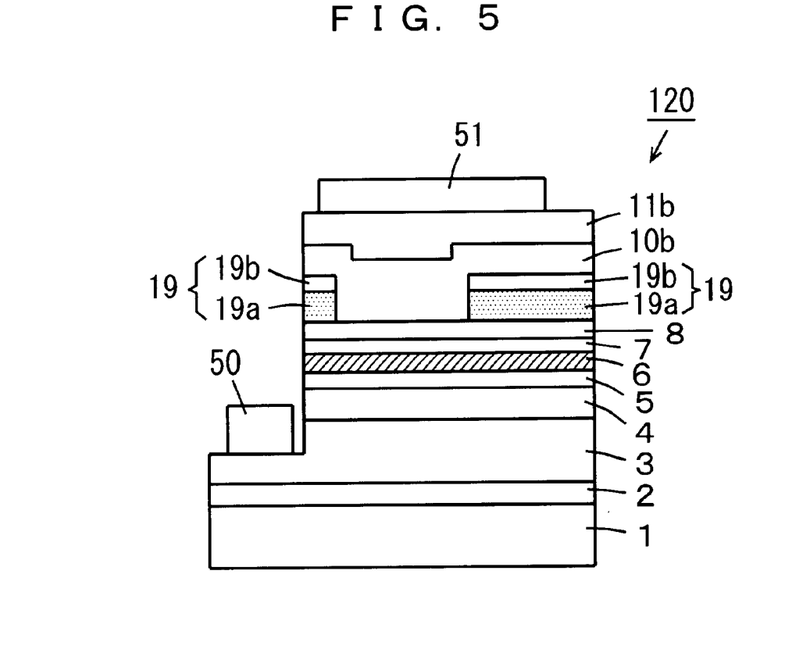
FIG. 5 is a typical sectional view of a GaN based semiconductor laser device according to a third embodiment of the present invention.

FIG. 5 is a typical sectional view of a semiconductor laser device 120 according to a third embodiment of the present invention.

The semiconductor laser device 120 shown in FIG. 5 is similar in structure to the semiconductor laser device 100 except the following points:

In the semiconductor laser device 120, the thickness of an n-light cladding layer 4a made of n-$Al_{0.1}Ga_{0.9}N$ is different from that of the n-light cladding layer 4 of the semiconductor laser device 100 as described later. Further, an n-current blocking layer 19 having an opening is formed on a p-light guide layer 8, and this n-current blocking layer 19 is formed by successively stacking an n-first current blocking layer 19a and an n-second current blocking layer 19b of n-$Al_{0.3}Ga_{0.7}N$. A p-light cladding layer 10b of p-$Al_{0.1}Ga_{0.9}N$ is formed on the n-second current blocking layer 19b and on the p-light guide layer 8 in the opening, and a p-contact layer 11b of p-GaN is formed on the p-light cladding layer 10b.

Table 2 shows the thicknesses and carrier concentrations of the n-light cladding layer 4a, the n-first and second current blocking layers 19a and 19b, the p-light cladding layer 10b and the p-contact layer 11b.

TABLE 2

|  | Carrier Concentration ($cm^{-3}$) | Thickness (nm) |
| --- | --- | --- |
| n-Light Cladding Layer 4a | $7 \times 10^{18}$ | 700 |
| n-First Current Blocking Layer 19a | $1 \times 10^{17}$ | 400 |
| n-Second Current Blocking Layer 19b | $1 \times 10^{19}$ | 100 |
| p-Light Cladding Layer 10b | $7 \times 10^{17}$ | 450 |
| p-Contact Layer 11b | $1 \times 10^{18}$ | 500 |

The semiconductor laser device 120 has a self-alignment structure similarly to the semiconductor laser device 100, and transverse mode control is performed by the n-current blocking layer 19.

The Al composition of the n-first current blocking layer 19a having a low electron concentration of $1 \times 10^{17}$ $cm^{-3}$ is greater than 0.1 and the surface thereof is terminated with N, similarly to the n-current blocking layer 9,of the semiconductor laser device 100. Thus, the n-first current blocking layer 19a contains a positive piezoelectric field. Also in the semiconductor laser device 120, therefore, applied positive bias is employed for canceling the piezoelectric field thereby current which does not contribute to the laser oscillation is reduced, similarly to the semiconductor laser device 100. Thus, operating current and threshold current are reduced and improvement of luminous efficiency is attained in the semiconductor laser device 120.

In the semiconductor laser device 120, a depletion layer is formed in the vicinity of a p-n junction interface between the n-second current blocking layer 19b and the p-light cladding layer 10b. In this case, the n-second current blocking layer 19b has an electron concentration of $1 \times 10^{19}$ cm$^{-3}$, which is higher than the hole concentration of the p-light cladding layer 10b. Therefore, the depletion layer is formed on the side of the p-light cladding layer 10b.

If the depletion layer is formed on the side of the n-current blocking layer, holes in the p-light cladding layer diffuse into the n-current blocking layer through the depletion layer. Thus, current which does not contribute to the laser oscillation is increased. When the depletion layer is formed on the side of the p-light cladding layer 10b as in the semiconductor laser device 120, holes can be prevented from diffusing into the n-second blocking layer 19b from the p-light cladding layer 10b, whereby current which does not contribute to the laser oscillation is reduced. In the semiconductor laser device 120 having the n-second current blocking layer 19b, which is a high electron concentration layer, stacked on the n-first current blocking layer 19a, therefore, the operating current and the threshold current can be further reduced, whereby the luminous efficiency is further improved.

While the n-second current blocking layer 19b having a high electron concentration is stacked on the n-first current blocking layer 19a having a low electron concentration in the semiconductor laser device 120, the n-current blocking layer having a low electron concentration may alternatively be stacked on the n-current blocking layer having a high electron concentration.

Further, the n-first and second current blocking layers may be made of different materials In this case, n-AlGaN may be employed as the material for the n-first current blocking layer having a low electron concentration, for example, and n-GaN may be employed as the material for the n-second current blocking layer having a high electron concentration if exerting no bad influence on transverse mode control of the semiconductor laser device. n-GaN, containing no Al, does not increase strain of the current blocking layer.

Figure 6:
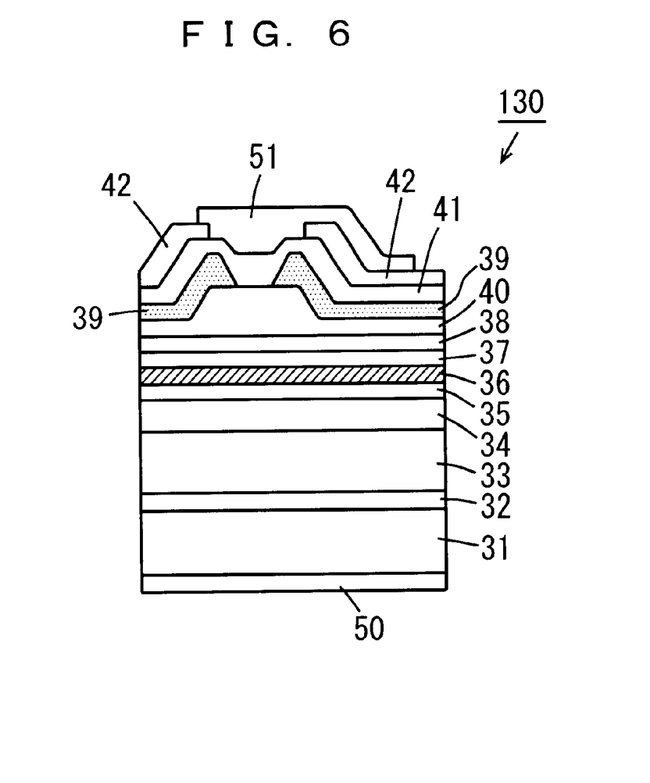
FIG. 6 is a typical sectional view of a GaN based semiconductor laser device according to a fourth embodiment of the present invention.

FIG. 6 is a typical sectional view of a semiconductor laser device 130 according to a fourth embodiment of the present invention.

In the semiconductor laser device 130 shown in FIG. 6, an n-buffer layer 32 of n-Al$_{0.5}$Ga$_{0.5}$N, an n-GaN layer 33 of n-GaN, an n-light cladding layer 34 of n-Al$_{0.2}$Ga$_{0.8}$N, an n-light guide layer 35 of n-Al$_{0.1}$Ga$_{0.9}$N, an emission layer 36 of n-GaN, a p-cap layer 37 of p-Al$_{0.15}$Ga$_{0.85}$N, a p-light guide layer 38 of p-Al$_{0.1}$Ga$_{0.9}$N and a p-light cladding layer 40 of p-Al$_{0.2}$Ga$_{0.8}$N are successively formed on a 6H-SiC substrate 31, having a thickness of 300 μm, of n-SiC having a carrier concentration of $1 \times 10^{18}$ cm$^{-3}$. The p-light cladding layer 40 is etched to define a ridge part. Further, an n-current blocking layer 39 of n-In$_{0.1}$Ga$_{0.9}$N having an opening located on the upper surface of the ridge part is formed on the p-light cladding layer 40, and a p-contact layer 41 of p-GaN is formed on the p-light cladding layer 40 in the opening and the n-current blocking layer 39. An insulating film 42 of SiO$_2$ having a thickness of 800 nm is formed on the region of the n-current blocking layer 39 located on the p-contact layer 41.

An n-type electrode 50 is formed on the back surface of the 6H-SiC substrate 31. A p-type electrode 51 is formed on the p-contact layer 41. Thus, the semiconductor laser device 130 has a ridge guided structure, similarly to the semiconductor laser device 100. Table 3 shows the thicknesses and carrier concentrations of the layers 32 to 41.

TABLE 3

|  | Carrier Concentration (cm$^{-3}$) | Thickness (nm) |
| --- | --- | --- |
| n-Buffer Layer 32 | $1 \times 10^{18}$ | 20 |
| n-GaN Layer 33 | $1 \times 10^{19}$ | 4000 |
| n-Light Cladding Layer 34 | $8 \times 10^{18}$ | 700 |
| n-Light Guide Layer 35 | $6 \times 10^{18}$ | 100 |
| Emission Layer 36 | $1 \times 10^{18}$ | 20 |
| p-Cap Layer 37 | $7 \times 10^{17}$ | 20 |
| p-Light Guide Layer 38 | $1 \times 10^{18}$ | 100 |
| n-Current Blocking Layer 39 | $1 \times 10^{17}$ | 200 |
| p-Light Cladding Layer 40 | $7 \times 10^{17}$ | 450 |
| p-Contact Layer 41 | $1 \times 10^{18}$ | 500 |

In the semiconductor laser device 130, the insulating film 42 and the n-current blocking layer 39 narrow current injected from the p-type electrode 51. Thus, a current injection region is defined in the ridge part, and an emission part is formed in the region of the emission layer 36 located under the current injection region.

The n-current blocking layer 39, having a smaller band gap than the emission layer 36, absorbs light of a higher mode generated in the emission layer 36. Therefore, light is concentrated to the region of the emission layer 36 located under the opening of the n-current blocking layer 39 and horizontally confined in the emission layer 36. Thus, the semiconductor laser device 130 has a loss guided structure.

Transverse mode control is performed in the semiconductor laser device 130 due to the aforementioned current narrowing by the n-current blocking layer 39 and light confinement in the emission layer 36.

When formed on a sapphire substrate, the n-current blocking layer 39 having a larger lattice constant than the sapphire substrate is subject to compressive strain. Thus, a negative piezoelectric field is generated in the n-current blocking layer 39. Therefore, the energy band of the n-current blocking layer 39 formed on a sapphire substrate is inclined toward the upper right contrarily to the case of the n-current blocking layer 9 shown in FIG. 2. In the semiconductor laser device 130, therefore, the n-current blocking layer 39 is formed on the 6H-SiC substrate 31. In this case, the n-current blocking layer 39 having a smaller lattice constant than the 6H-SiC substrate 31 is subject to tensile strain. Therefore, a positive piezoelectric field is generated in the n-current blocking layer 39. In this case, the n-current blocking layer 39 having a low electron concentration of $1 \times 10^{17}$ cm$^{-3}$ contains the positive piezoelectric field. Therefore, the energy band of the n-current blocking layer 39 is inclined toward the lower right, similarly to the case of the n-current blocking layer 9 shown in FIG. 2.

In the n-current blocking layer 39 containing the positive piezoelectric field, applied positive bias is employed for canceling the piezoelectric field whereby current which does not contribute to the laser oscillation is reduced, similarly to the n-current blocking layer 9 shown in FIG. 1. Thus, operating current and threshold current are reduced in the semiconductor laser device 130, to attain improvement of the luminous efficiency.

While the respective layers forming the semiconductor laser devices 100, 110, 120 and 130 according to the aforementioned embodiments are made of nitride based semiconductors containing Ga, Al and In, the layers may alternatively contain B and Tl.

The present invention is also applicable to a semiconductor laser device other than a GaN based semiconductor laser device as well as to a semiconductor light emitting device, such as a light emitting diode, other than the semiconductor laser device.

INVENTIVE EXAMPLES

Inventive Example 1

The semiconductor laser device 100 shown in FIG. 1, provided with an n-current blocking layer 9 of undoped $Al_{0.2}Ga_{0.8}N$ having an electron concentration of $1\times10^{17}$ $cm^{-3}$, was prepared. While this n-current blocking layer 9 was not intentionally doped with an n-type impurity, the electron concentration of the n-current blocking layer 9 was about $1\times10^{17}$ $cm^{-3}$ due to the tendency of AlGaN to the n type.

In the semiconductor laser device 100, threshold current and a current value measured upon application of voltage of 2 V were 280 mA and 1.6 mA respectively.

For the purpose of comparison, a semiconductor laser device similar in structure to the semiconductor laser device 100 was prepared with an n-current blocking layer 9 of n-$Al_{0.3}Ga_{0.7}N$ having an electron concentration of $3\times10^{19}$ $cm^{-3}$ and subjected to measurement similar to the above. In this case, the threshold current was 315 mA and the current value was 3.3 mA.

Inventive Example 2

The semiconductor laser device 110 shown in FIG. 4, provided with an n-current blocking layer 9a of undoped $Al_{0.2}Ga_{0.8}N$ having an electron concentration of $1\times10^{17}$ $cm^{-3}$, was prepared.

In the semiconductor laser device 110, threshold current and a current value measured upon application of voltage of 2 V were 275 mA and 1.1 mA respectively.

For the purpose of comparison, a semiconductor laser device similar in structure to the semiconductor laser device 110 was prepared with an n-current blocking layer 9a of n-$Al_{0.3}Ga_{0.7}N$ having an electron concentration of $3\times10^{19}$ $cm^{-3}$ and subjected to measurement similar to the above. In this case, the threshold current was 305 mA and the current value was 3 mA.

Inventive Example 3

The semiconductor laser device 120 shown in FIG. 5, provided with an n-first current blocking layer 19a of undoped $Al_{0.2}Ga_{0.8}N$ having an electron concentration of $1\times10^{17}$ $cm^{-3}$, was prepared.

In the semiconductor laser device 120, threshold current and a current value measured upon application of voltage of 2 V were 225 mA and 0.6 mA respectively.

Inventive Example 4

The semiconductor laser device 130 shown in FIG. 6, provided with an n-current blocking layer 39 of n-$In_{0.1}Ga_{0.9}N$ having an electron concentration of $1\times10^{17}$ $cm^{-3}$, was prepared.

In the semiconductor laser device 130, a current value measured upon application of voltage of 5 V was 3.5 mA.

For the purpose of comparison, a semiconductor laser device similar in structure to the semiconductor laser device 130 was prepared with an n-current blocking layer 39 having an electron concentration of $5\times10^{19}$ $cm^{-3}$ and subjected to measurement similar to the above. In this case, the current value was 3.8 mA.

As understood from the aforementioned Inventive Examples, the inventive semiconductor laser devices 100, 110, 120 and 130 provided with the n-current blocking layers 9, 9a, 19a and 39 having the electron concentration of $1\times10^{17}$ $cm^{-3}$ can reduce current which does not contribute to the laser oscillation, to exhibit high luminous efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor light emitting device comprising:

a first conductivity type first semiconductor layer formed of a group III nitride based semiconductor;

a second conductivity type second semiconductor layer formed of a group III nitride based semiconductor and having a current injection region;

an emission layer formed of a group III nitride based semiconductor, provided between said first semiconductor layer and said second-semiconductor layer, into which current is injected through said current injection region due to application of positive bias between said first semiconductor layer and said second semiconductor layer; and a current blocking layer formed of a group III nitride based semiconductor, provided in said second semiconductor layer except said current injection region, wherein said current blocking layer has strain so as to contain an electric field reverse to said positive bias by piezoelectric effect, the carrier concentration of said current blocking layer is lower than $1\times10^{19}$ $cm^{-3}$, said current blocking layer contains aluminum and gallium, the surface of said current blocking layer is terminated with nitrogen, and the aluminum composition of said current blocking layer is greater than 0.1.

2. A semiconductor light emitting device comprising:

a first conductivity type first semiconductor layer formed of a group III nitride based semiconductor;

a second conductivity type second semiconductor layer formed of a group III nitride based semiconductor and having a current injection region;

an emission layer formed of a group III nitride based semiconductor, provided between said first semiconductor layer and said second semiconductor layer, into which current is injected through said current injection region due to application of positive bias between said first semiconductor layer and said second semiconductor layer; and a current blocking layer formed of a group III nitride based semiconductor, provided in said second semiconductor layer except said current injection region, wherein said current blocking layer has strain so as to contain an electric field reverse to said positive bias by piezoelectric effect, the carrier concentration of said current blocking layer is lower than $1\times10^{19}$ $cm^{-3}$, said current blocking layer contains aluminum and gallium, the surface of said current blocking layer is terminated with gallium and aluminum, and the aluminum composition of said current blocking layer is less than 0.1.

3. The semiconductor light emitting device according to claim 1, wherein said second semiconductor layer includes a first conductivity type carrier concentration layer, stacked on said current blocking layer, having a carrier concentration higher than that of said current blocking layer.

4. The semiconductor light emitting device according to claim 1, wherein said current blocking layer is made of a nitride based semiconductor containing at least one of gallium, aluminum, indium, thallium and boron.

5. The semiconductor light emitting device according to claim 4, wherein said first semiconductor layer, said emission layer and said second semiconductor layer are made of a nitride based semiconductor containing at least one of gallium, aluminum, indium, thallium and boron.

6. The semiconductor light emitting device according to claim 4, wherein said current blocking layer has a crystal growth surface prepared from a (0001) plane of said nitride based semiconductor.

7. The semiconductor light emitting device according to claim 4, wherein the refractive index of said current blocking layer is smaller than the refractive index of said current injection region.

8. The semiconductor light emitting device according to claim 7, further comprising a sapphire substrate, wherein said first semiconductor layer, said emission layer, said second semiconductor layer and said current blocking layer are formed on said sapphire substrate.

9. The semiconductor light emitting device according to claim 1, wherein said first semiconductor layer includes a first conductivity type cladding layer, and said second semiconductor layer includes a second conductivity type cladding layer.

10. The semiconductor light emitting device according to claim 2, wherein said second semiconductor layer includes a first conductivity type carrier concentration layer, stacked on said current blocking layer, having a carrier concentration higher than that of said current blocking layer.

11. The semiconductor light emitting device according to claim 2, wherein said current blocking layer is made of a nitride based semiconductor containing at least one of a gallium, aluminum, indium, thallium and boron.

12. The semiconductor light emitting device according to claim 11, wherein said first semiconductor layer, said emission layer and said second semiconductor layer are made of a nitride based semiconductor containing at least one of gallium, aluminum, indium, thallium and boron.

13. The semiconductor light emitting device according to claim 11, wherein said current blocking layer has a crystal growth surface prepared from a (0001) plane of said nitride based semiconductor.

14. The semiconductor light emitting device according to claim 11, wherein the refractive index of said current blocking layer is smaller than the refractive index of said current injection region.

15. The semiconductor light emitting device according to claim 14, wherein said current blocking layer is made of a nitrate based semiconductor containing aluminum and gallium, the surface of said current blocking layer is terminated with gallium and aluminum, and the aluminum composition of said current blocking layer is less than 0.1.

16. The semiconductor light emitting device according to claim 15, further comprising a sapphire substrate, wherein said first semiconductor layer, said emission layer, said second semiconductor layer and said current blocking layer are formed on said sapphire substrate.

17. The semiconductor light emitting device according to claim 2, wherein said first semiconductor layer includes a first conductivity type cladding layer, and said second semiconductor layer includes a second conductivity type cladding layer.

* * * * *